(12) United States Patent
Heid

(10) Patent No.: US 10,527,693 B2
(45) Date of Patent: Jan. 7, 2020

(54) SUPERCONDUCTING MAGNET ARRANGEMENT FOR MAGNETIC RESONANCE IMAGING SCANNER

(71) Applicant: Siemens Aktiengesellschaft, München (DE)

(72) Inventor: Oliver Heid, Erlangen (DE)

(73) Assignee: Siemens Healthcare Limited, Camberley (GB)

( * ) Notice: Subject to any disclaimer, the term of this patent is extended or adjusted under 35 U.S.C. 154(b) by 216 days.

(21) Appl. No.: 15/546,314

(22) PCT Filed: Jan. 27, 2016

(86) PCT No.: PCT/EP2016/051665
§ 371 (c)(1),
(2) Date: Jul. 26, 2017

(87) PCT Pub. No.: WO2016/120309
PCT Pub. Date: Aug. 4, 2016

(65) Prior Publication Data
US 2018/0024210 A1 Jan. 25, 2018

(30) Foreign Application Priority Data

Jan. 27, 2015 (DE) .................. 10 2015 201 373

(51) Int. Cl.
*G01R 33/3815* (2006.01)
*F17C 3/08* (2006.01)
(Continued)

(52) U.S. Cl.
CPC .......... *G01R 33/3815* (2013.01); *F17C 3/085* (2013.01); *G01R 33/3802* (2013.01); *G01R 33/3804* (2013.01); *H01F 6/06* (2013.01)

(58) Field of Classification Search
CPC ............... F17C 13/087; F17C 2203/00; F17C 2203/01; F17C 2203/014; F17C 2203/015;
(Continued)

(56) References Cited

U.S. PATENT DOCUMENTS 3,155,265 A * 11/1964 Reese ..................... F17C 3/022
220/560.05
3,389,353 A * 6/1968 Kafka ....................... H01F 6/00
335/216
(Continued)

FOREIGN PATENT DOCUMENTS

| CN | 101114012 A | 1/2008 |
|---|---|---|
| CN | 101493506 A | 7/2009 |

(Continued)

OTHER PUBLICATIONS

German Search Report for related German Application No. 10 2015 201 373.1 dated Aug. 4, 2015.
(Continued)

*Primary Examiner* — Steven L Yeninas
(74) *Attorney, Agent, or Firm* — Lempia Summerfield Katz LLC

(57) ABSTRACT

A superconducting magnetic arrangement includes a magnetic coil unit. The magnetic coil unit includes a number of superconducting magnetic coils and a cryostat with an insulating vessel for cooling the magnetic coil unit. The magnetic coil unit is arranged in a vacuum in the insulating vessel. The magnetic coil unit is held in the interior of the insulating vessel by a maximum of six longitudinal bearing elements that each extend between the magnetic coil unit and the insulating vessel such that a rotary movement and a translatory movement of the magnetic coil unit relative to the insulating vessel is restrained by the bearing elements.

25 Claims, 3 Drawing Sheets

(51) Int. Cl.
*G01R 33/38* (2006.01)
*H01F 6/06* (2006.01)

(58) Field of Classification Search
CPC ........ F17C 2203/0161; F17C 2203/017; F17C 2203/0687; F17C 2270/0509; F17C 2270/0527; F17C 2270/0536; G01R 33/3802; G01R 33/3804; G01R 33/3815; H01F 6/00; H01F 6/04; H01F 6/06
USPC ............... 62/51.1, 259.2; 220/560.04, 560.1, 220/560.12, 901; 248/317; 324/319, 324/322; 335/216, 300; 505/885, 892, 505/898
See application file for complete search history.

(56) References Cited

U.S. PATENT DOCUMENTS

| | | | | |
|---|---|---|---|---|
| 3,485,272 | A * | 12/1969 | Hawkins | F16L 9/04 138/112 |
| 4,492,090 | A * | 1/1985 | Laskaris | F17C 13/087 138/112 |
| 4,516,405 | A * | 5/1985 | Laskaris | F17C 3/085 138/112 |
| 4,599,592 | A * | 7/1986 | Marsing | G01R 33/3815 335/216 |
| 6,185,808 | B1 * | 2/2001 | Ranze | F17C 3/04 220/23.89 |
| 7,646,272 | B1 * | 1/2010 | Schmierer | G01R 33/3802 335/216 |
| 2007/0151796 | A1 | 7/2007 | Heid | |
| 2008/0022698 | A1 * | 1/2008 | Hobbs | F17C 3/085 62/51.1 |
| 2008/0295528 | A1 * | 12/2008 | Mann | G01R 33/3802 62/51.1 |
| 2009/0188261 | A1 * | 7/2009 | Mann | G01R 33/3804 62/51.1 |
| 2009/0273348 | A1 * | 11/2009 | Tigwell | G01R 33/3804 324/318 |
| 2009/0279260 | A1 * | 11/2009 | Yu | G01R 33/3804 361/702 |
| 2018/0277291 | A1 * | 9/2018 | Bickell | H01F 6/06 |

FOREIGN PATENT DOCUMENTS

| | | |
|---|---|---|
| DE | 10332833 B4 | 7/2005 |
| EP | 0156017 A1 | 10/1985 |
| GB | 2440350 A | 1/2008 |
| GB | 2456795 A | 7/2009 |
| GB | 2503448 A | 1/2014 |

OTHER PUBLICATIONS

PCT International Search Report and Written Opinion of the International Searching Authority dated May 4, 2016 for corresponding PCT/EP2016/051665.
Chinese Office Action for Chinese Application No. 201680007494.3 dated Jun. 1, 2018.

* cited by examiner

SUPERCONDUCTING MAGNET ARRANGEMENT FOR MAGNETIC RESONANCE IMAGING SCANNER

CROSS REFERENCE TO RELATED APPLICATIONS

The present patent document is a § 371 nationalization of PCT Application Serial Number PCT/EP2016/051665, filed Jan. 27, 2016, designating the United States, which is hereby incorporated by reference. This patent document also claims the benefit of DE 102015201371.1, filed on Jan. 27, 2015, which is also hereby incorporated by reference.

FIELD

Embodiments relate to a superconducting magnetic arrangement, e.g. for a magnetic resonance tomograph.

BACKGROUND

A superconducting magnetic arrangement includes a magnetic coil unit including a number of superconducting magnetic coils, the windings of which are made of superconducting material. In order to effect superconductivity in the magnetic coils, the magnetic coil unit is cooled by a cryostat. The magnetic coil unit is held or suspended in a permanent position in an insulating vessel of the cryostat. The insulating vessel may be a vacuum vessel. The insulating vessel may include a different type of thermal insulation. The suspension is achieved by a number of rods or loops extending between the magnetic coil unit and the insulating vessel of the cryostat. The rods or loops result in heat input into the cooled magnetic coil unit as one end of each of the rods is connected to the relatively warm insulating vessel.

SUMMARY AND DESCRIPTION

The scope of the present invention is defined solely by the appended claims and is not affected to any degree by the statements within this summary. The present embodiments may obviate one or more of the drawbacks or limitations in the related art.

Embodiments provide a magnetic arrangement in which the magnetic coil unit is held stably in the insulating vessel and simultaneously heat input into the magnetic coil unit is kept low.

The superconducting magnetic arrangement may be provided for a magnetic resonance tomograph. The arrangement includes a magnetic coil unit including a number (e.g. at least one) of superconducting magnetic coils, and a cryostat with an insulating vessel for cooling the magnetic coil unit. The magnetic coil unit may be arranged in a vacuum in the insulating vessel. In an embodiment, the magnetic coil unit may include a housing. The housing may be a cryogen tank in which the magnetic coils are at least partially immersed in liquid cryogen, such as helium, or are cooled by circulation of gaseous cryogen, such as helium. Embodiments also include where the housing is not a cryogen tank, and the magnetic coils are surrounded by a housing without cryogen filling.

In an embodiment, the magnet coil unit is not provided with any housing, but is directly mounted within the insulating vessel. To cool the magnetic coil unit, liquid cryogen such as helium is generated via a cooling device of the cryostat and transported via cooling lines to the superconducting windings of the magnetic coils.

Embodiments may have coils that are cooled by thermal conduction along a solid conduit. In such an arrangement, a conductive bus bar or laminate or braid or similar is thermally linked between coils at one end and a cryogenic refrigerator at the other end.

In the superconducting magnetic arrangement, the magnetic coil unit is held in the interior of the insulating vessel by a maximum of six longitudinal bearing elements extending between the magnetic coil unit and the insulating vessel such that that rotary movement and translatory movement of the magnetic coil unit relative to the insulating vessel is restrained by the bearing elements. For example, precisely six bearing elements may be provided, by which both the three rotary degrees of freedom and the three translatory degrees of freedom of the movement of the magnetic coil unit with respect to the insulating vessel are restrained with low stress on the bearing elements.

The magnetic arrangement has the advantage that, due to the use of a low number of maximum six bearing elements, the heat input into the magnetic coil unit is kept low and the cooling efficiency of the cryostat is improved.

In an embodiment, the longitudinal bearing elements are attached to the insulating vessel and the magnetic coil unit such that the bearing elements are each exposed to tensile or compressive stress in the longitudinal direction. The bearing elements are each only exposed to force in the longitudinal direction using an articulated attachment of the bearing elements to the magnetic coil unit or the insulating vessel. The attachment avoids stress on the bearing elements due to torsion forces or bending forces.

In an embodiment, none of the longitudinal bearing elements are parallel to another bearing element in the longitudinal direction thus achieving stable suspension with a low number of rods.

In an embodiment, the magnetic coil unit includes a housing, where the housing of the magnetic coil unit is surrounded by an insulating vessel. The bearing elements are attached to attachment points on the housing of the magnetic coil unit and to attachment points on the insulating vessel. The attachment points may be provided directly on the corresponding housing and the insulating vessel. Alternatively, the attachment points may lie indirectly on the respective housing and insulation vessel, for example using a ring.

The shape of the housing may be different from the shape of the magnetic coil unit. However, the housing of the magnetic coil unit and also the insulating vessel are cylindrical, at least in sections.

In an embodiment, one end of each of the longitudinal bearing elements is attached to a respective attachment point on a ring attached to the insulating vessel, and the other end of each of the longitudinal bearing elements is attached to a respective attachment point on the magnetic coil unit. The ring extends substantially perpendicularly to the axial direction of a cylindrical magnetic coil unit. A subset of the respective attachment points on the magnetic coil unit are offset toward one end and another subset of the respective attachment points on the magnetic coil unit are offset toward the other end of the magnetic coil unit relative to the ring.

Embodiments of the magnetic arrangement provide a simple design for the magnetic coil unit holder. The bearing elements are exposed to tensile stress in the longitudinal direction. The ring used may optionally only be part of an annular section of the insulating vessel without having to have a particular structural embodiment. Similarly, the ring may be an attachment ring in the form of a projection extending from the insulating vessel into the interior of the insulating vessel. The ring may be arranged centrally in the axial direction between the two ends of the cylindrical magnetic coil unit. The ring need not be a continuous annular structure, but may be intermittently provided, even as a number of mounting brackets.

In an embodiment, the attachment points of the bearing elements are arranged on the ring symmetrically around the circumference of the ring, e.g. the angle between adjacent attachment points is always the same providing a uniform transmission of force.

In a further embodiment, two bearing elements extend in the longitudinal direction from the ring towards one axial end of the magnetic coil unit, while four bearing elements extend in the longitudinal direction from the ring towards the other axial end of the magnetic coil unit.

In a further embodiment, three pairs of bearing elements are provided, where the bearing elements of a respective pair are attached to attachment points offset with respect to one another around the circumference of the ring and from there converge toward one another in a V-shape in the direction of one or the other axial end of the magnetic coil unit. The bearing elements of a pair extend in the direction of one axial end of the magnetic coil unit while the bearing elements of the other two pairs extend in the direction of the other axial end of the magnetic coil unit. The bearing elements of a respective pair are attached to substantially the same attachment point on the magnetic coil unit. The embodiment provides stable holding of the magnetic coil unit with precisely six bearing elements.

In an embodiment, the pairs of bearing elements are arranged in the circumferential direction of the ring adjacent to one another, where adjacent bearing elements of different pairs in the circumferential direction are attached to substantially the same attachment point on the ring.

In a further embodiment of the magnetic arrangement, the bearing elements extend from respective attachment points on a cylindrical magnetic coil unit to respective attachment points on the insulating vessel in such a manner that the axis of the magnetic coil unit is in a horizontal plane. The horizontal plane is a plane perpendicular to the force of gravity when the magnetic arrangement is installed as prescribed. The bearing elements may extend inclined to the horizontal plane.

In an embodiment, the attachment points of the bearing elements on the magnetic coil unit are arranged at least partially offset with respect to one another in the axial direction of the cylindrical magnetic coil unit. Three pairs of bearing elements are provided, where the bearing elements of a respective pair are attached to different attachment points on the housing of the magnetic coil unit and converge toward one another in a V-shape toward the insulating vessel. The bearing elements of a respective pair are attached to the same attachment point on the insulating vessel. Two bearing elements of two different pairs may be attached to substantially the same attachment point on the magnetic coil unit.

The embodiment provides a stable holding of the magnetic coil unit in the style of a tripod. In a top view, the attachment points of the bearing elements on the magnetic coil unit may form a first triangle on the magnetic coil unit, while, in a top view, the attachment points of the bearing elements on the insulating vessel may form a second triangle in the vertical direction on the insulating vessel. In a top view, the first triangle is offset with respect to the second triangle in the vertical direction and offset by rotation, for example, by approximately 180°. A particularly stable support is provided for the magnetic coil unit. The vertical direction refers to the direction of the force of gravity when the magnetic arrangement is set up in the prescribed manner, and the horizontal direction refers to perpendicular to the vertical direction.

In a further embodiment of the magnetic arrangement, the bearing elements are rods or loops that may be subjected to tensile and/or compressive stress, where the loops may be O-shaped or in the shape of the figure "8". Fiber-reinforced plastic may be used as the material for the bearing elements.

In an embodiment, the bearing elements each include a non-linear spring element or are embodied as non-linear spring elements. The spring stiffness of the non-linear spring element reduces in the longitudinal direction of the respective bearing element when forces exerted on the respective bearing element exceed forces exerted on the bearing elements in the resting position of the magnetic arrangement providing a relatively rigid holding of the magnetic coil unit in the resting position. However, in the case of additional forces, such as, for example, in the case of vibrations induced in the operation of the magnetic arrangement, the application of force on the sensitive magnetic coils is reduced.

In an embodiment, the non-linear spring elements in the respective bearing elements are arranged closer to the insulating vessel than to the magnetic coil unit. The bearing elements are located on the warm side the magnetic arrangement adjacent to the insulating vessel so that cold-induced brittleness of the spring material of the non-linear spring elements is avoided.

DETAILED DESCRIPTION

Figure 1:
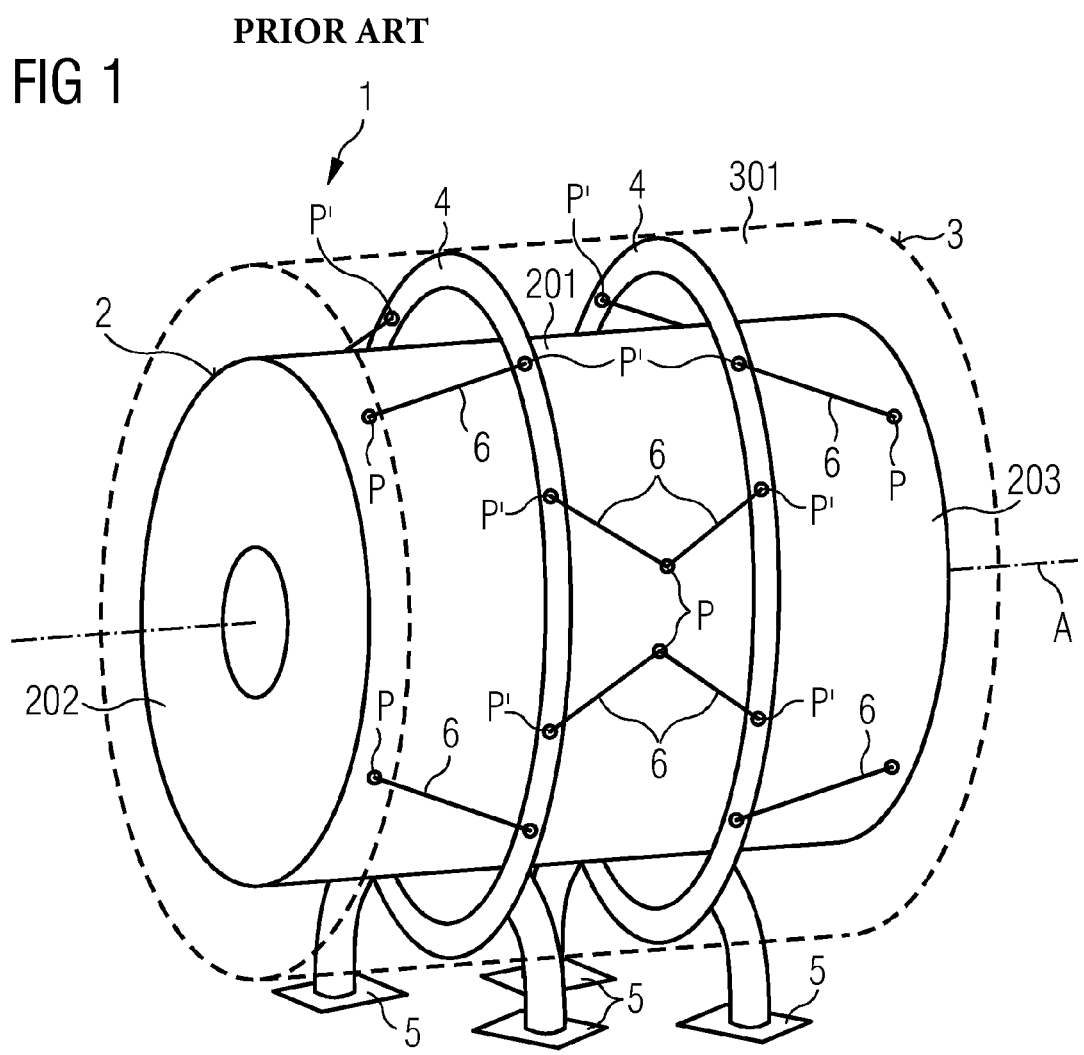
FIG. 1 depicts a schematic view of a superconducting magnetic arrangement.

FIG. 1 shows one embodiment of a magnetic arrangement 1. The magnetic arrangement 1 includes a cylindrical magnetic coil unit 2 with an optional cryogen tank or other housing 201, and a front end 202 and a rear end 203. The housing 201 includes a plurality of magnetic coils with superconducting windings arranged one behind the other in the direction of the axis of symmetry or longitudinal axis A of the cylindrical arrangement. The magnetic coils are suspended at least partially immersed in liquid cryogen in the housing 201. The plurality of magnetic coils are cooled by a cryostat that includes an insulating vessel 301. The insulating vessel 301, similarly to the magnetic coil unit 2, may be cylindrical and is indicated by dashed lines in FIG. 2. In other embodiments, no cryogen tank or other housing is provided, and the magnetic coils may be suspended within the insulating vessel without a cryogen tank or outer housing.

Both the magnetic coil unit 2 and the insulating vessel 3 are provided with a central through-hole around the axis A to accommodate a patient for the performance of examinations based on magnetic resonance tomography in the arrangement.

In addition to the insulating vessel 3, the cryostat includes a cooling device that is not shown in FIG. 1 but may be arranged above the magnetic arrangement. In embodiments with no cryogen tank, the cooling device uses a cooling circuit with lines that run in contact with the magnetic coil unit to cool the magnetic coils. For insulation, the magnetic coil unit is located inside the insulating vessel, which may be evacuated. Other forms of thermal insulation may be provided in addition to, or instead of, a vacuum.

To mount the magnetic coil unit 2 in the insulating vessel 3, two circumferential attachment rings 4 are provided along the container 3. The magnetic coil unit 2 is suspended on the rings 4 by bearing elements such as rods or optionally also loops. The rods may be made of any material, such as a plastic or a glass or carbon-fiber reinforced plastic, providing that both the strength and the thermal conductivity specifications are acceptable. The rods and/or loops may be made of steel, for example, providing that acceptable strength and the thermal conductivity parameters are met.

The respective rods extend between attachment points P on the magnetic coil unit 2 and attachment points P' on the respective two rings 4. In the arrangement in FIG. 1, the individual rods 6 are exposed to tensile stress and a large number of these rods are present. In the magnetic arrangement 1, twelve rods may be used. Two supporting feet 5 are embodied on the rings 4 in each case so that the arrangement rests on a total of four supporting feet.

In the arrangement in FIG. 1, the magnetic coil unit 2 is a cold mass that is to be cooled with the lowest possible heat losses. However, the rods 6 represent a significant heat source to the cold mass. In order to minimize the heat input to the cold mass, the rods or loops may be thin and long. A further boundary condition with respect to the rods is imposed by the mechanical stress on the suspension of the cold mass. During transportation of the arrangement, greater forces may occur than in stationary operation. The suspension may only input low mechanical forces in the frequency range above one hertz into the cold mass. The mechanical forces are caused by vibrations during the operation of the arrangement.

In the arrangement in FIG. 1, due to the high number of suspension rods 6, there is also a relatively high heat input into the cold mass. The heat input is reduced by limiting the number of rods 6, as described and depicted in FIG. 2 and FIG. 3.

The conventional construction in FIG. 1 is hyperstatic because, for the suspension of the cold mass 2 in the insulating vessel 3, the construction takes account of only six degrees of freedom, three rotary degrees of freedom, and three translatory degrees of freedom to restrain the relative movement of the magnetic coil unit 2 with respect to the insulating vessel 3. However, the arrangement in FIG. 1 has a significantly higher number of rods than six.

Figure 2:
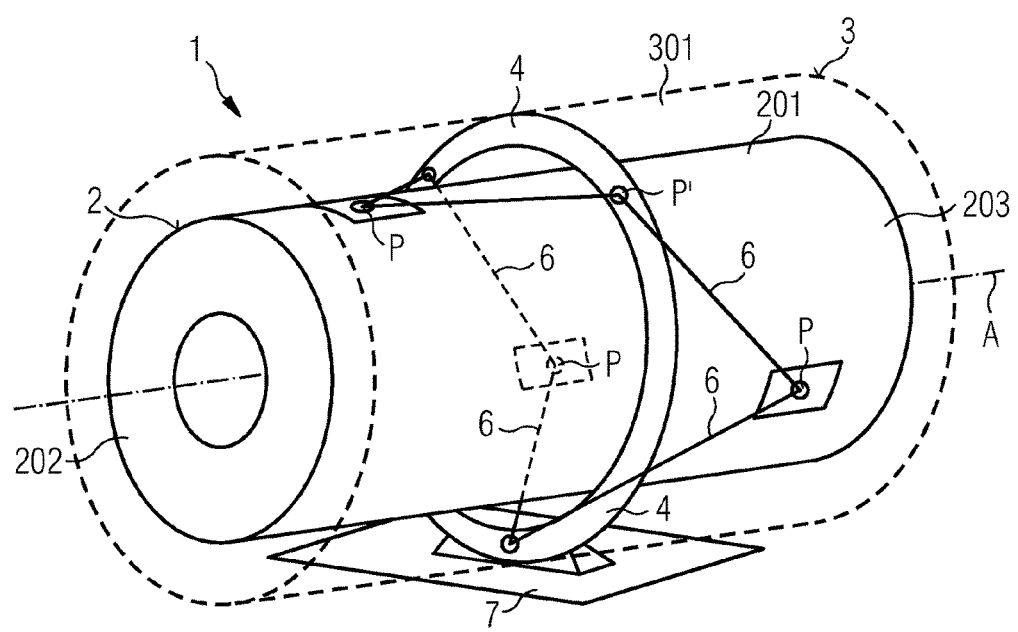
FIG. 2 depicts a schematic view of a superconducting magnetic arrangement according to an embodiment.

In the embodiment in FIG. 2, only six rods are used to suspend the magnetic coil unit 2 in the insulating vessel 3. The number is sufficient to suppress all translatory relative movements and a rotary relative movement of the magnetic coil unit with respect to the insulating vessel 3. Otherwise, the arrangement in FIG. 2 is similarly constructed to the arrangement in FIG. 1. For example, the same magnetic coil unit 2 may include an optional housing 201 and two ends 202 and 203.

However, unlike FIG. 1, the insulating vessel 3 in FIG. 2 now only includes one ring 4 that is arranged in the direction of the longitudinal axis A centrally between the two ends of the magnetic coil unit 2 or of the insulating vessel 3 in the interior of the insulating vessel 3. The ring 4 is attached together with the insulating vessel 3 on a base plate 7 by which the arrangement in FIG. 2 is installed. The ring 4 is used for attachment to the rods 6. Three attachment points P' offset with respect to one another are provided on the ring. The ends of two rods are located on each attachment point. The rod ends do not have to be attached to exactly the same attachment point. On the magnetic coil unit 2, there are three attachment points P at which in each case two rods 6 terminate. The rods may also be attached individually to attachment points offset with respect to one another.

The rods 6 are exposed to tensile stress and may also be formed as loops of fiber-reinforced plastic. The six rods form three pairs of rods. One end of the rods of a respective pair is attached to a common attachment point P on the magnetic coil unit 2. From there, the rods extend in a V-shape toward different attachment points P' on the ring 4. The attachment points P of two of the three pairs are arranged in the direction of the axis A behind the ring in the drawing, toward the end 203 and below the cylindrical axis A of the magnetic coil unit 2. The attachment point P of the third pair is arranged in the direction of the axis A in front of the ring in the drawing, toward the end 202 and above the cylindrical axis A of the magnetic coil unit 2.

The individual rods of the respective pairs extend in the style of bicycle spokes with a very low angle (e.g. almost tangentially) from the respective attachment points P toward the attachment points P'. The attachment of the rods to the attachment points P or P' may be articulated so that the individual rods are exclusively exposed to tensile stress, and no torsion forces or bending forces are transmitted. The articulation provides low stress on the individual rods with a simultaneously reduced number of rods. FIG. 2 depicts a simple and efficient way to achieve the suspension of the cold mass 2 in the insulating vessel 3 and, at the same time, keep the heat input via the rods into the cold mass low.

Figure 3:
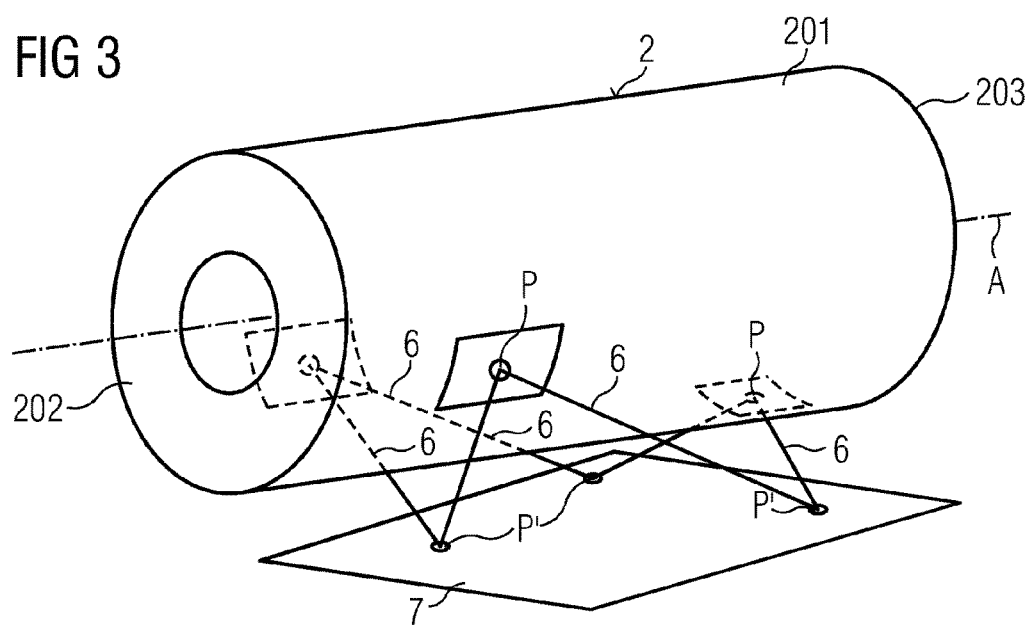
FIG. 3 depicts a schematic view of a superconducting magnetic arrangement according to an embodiment.

FIG. 3 depicts an embodiment of the magnetic arrangement. FIG. 3 includes the same magnetic coil unit 2 with optional outer housing 201 as that in FIG. 2. The magnetic coil unit is surrounded by the insulating vessel of a cryostat. The insulating vessel is not depicted in FIG. 3. The insulating vessel extends around the magnetic coil unit 2 and includes suitable bulges in the lower part, in which the attachment points P' depicted are located. The ends of the bulges with the attachment points P' located therein are attached to the base plate 7 on which the magnetic arrangement stands. Alternatively, the insulating vessel 3 may include an extended region that may be planar and may be used as, or attached to, the base plate 7.

Similar to FIG. 2, in FIG. 3, only six rods 6 are used to prevent the translatory or rotary movement of the magnetic coil unit 2 with respect to the insulating vessel 3. However, in the embodiment of FIG. 3, all the rods 6 are compression rods that are exposed to pressure from the weight of the magnetic coil unit 2. The rods are attached to the insulating vessel at the attachment points P', of which a total of three are provided. The ends of two rods are located at each of the attachment points P'. For attachment on the magnetic coil unit 2, three attachment points P are provided. The ends of two rods are arranged at each of the attachment points P. The individual rods 6 extend inclined to the horizontal direction (e.g., inclined to the direction of the plane of the base plate 7). As depicted, the rods and the attachment points P, P' may all be located below the cylindrical axis A of the magnetic coil unit 2.

The arrangement in FIG. 3 holds the magnetic coil unit 2 in the style of a tripod. The tripod is formed by three pairs of rods 6. The rods of a respective pair start at a common attachment point P' on the base plate or insulating vessel 3 and extend toward separate attachment points P on the magnetic coil unit 2. Two of the attachment points P are located closer to the "front" end 202 of the housing 201, as depicted in FIG. 3, than the further attachment point, which is arranged closer to the "rear" end 203 of the housing 201, as depicted in FIG. 3. In order to provide that no torsion forces act on the rods, the rods may be mounted in an articulated manner on the individual attachment points P or P'. When the optional outer housing 201 is not provided, two of the attachment points P may be located closer to the front end of the magnetic coil unit 2 than the further attachment point, which is arranged closer to the rear end of the magnetic coil unit 2.

Unlike FIG. 2, in FIG. 3, the rods 6 in FIG. 3 are exposed to compressive stress. The rods 6 may be embodied more rigidly in FIG. 3 than the rods in FIG. 2, which are exposed to tensile stresses. The materials used for the rods in the two embodiments in FIG. 2 and FIG. 3 may be fiber-reinforced plastic. When the rods are embodied in loop shape, the fibers may be wound in an O-shape or 8-shape, providing uniform stress on all fibers and avoiding concentrated loads.

In an embodiment, non-linear spring elements are integrated within the rods in FIG. 2 or FIG. 3. Spring elements are described, for example, in publication DE 103 32 833 B4. The non-linear spring elements provide reducing spring stiffness in the longitudinal direction of the respective rod when the forces exerted on the respective rod exceed the forces exerted on the rods in the resting position of the magnetic arrangement. A high stiffness is provided with the base load of the rods. However, in the case of loads that exceed the force, such as, for example, in the case of forces caused by vibrations, the spring stiffness decreases, thus reducing the transfer of force onto the sensitive magnetic coils in the magnetic coil unit. The individual spring elements in the rods may be arranged closer to the insulating vessel than to the magnetic coil unit. This prevents an excessively close arrangement on the cold side of the rods, resulting in increasing brittleness of the spring material of the spring elements.

The embodiments provide a low number of only six rods that may provide suspension of the cold mass in the insulating vessel such that all rotary and translatory movements of the magnetic coil unit with respect to the insulating vessel are restrained. Due to the low number of rods, the heat input from the rods into the cold mass is low. In addition, due to the use of non-linear spring elements in the rods, the transmission of force by vibrations onto the magnetic coil unit during the operation of the arrangement may be reduced.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present invention has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A superconducting magnetic arrangement comprising:
    a magnetic coil unit comprising superconducting magnetic coils, wherein the magnetic coil unit extends in a longitudinal direction along a longitudinal axis; and
    an insulating vessel, wherein the magnetic coil unit is arranged in the insulating vessel,
    wherein the magnetic coil unit is held in an interior of the insulating vessel by a maximum of six longitudinal bearing elements, each longitudinal bearing element of the longitudinal bearing elements being between the magnetic coil unit and the insulating vessel such that a rotary movement and a translatory movement of the magnetic coil unit relative to the insulating vessel is restrained by the longitudinal bearing elements, and
    wherein each longitudinal bearing element of the longitudinal bearing elements extends in the longitudinal direction.

2. The superconducting magnetic arrangement of claim 1, wherein the insulating vessel is a vacuum vessel.

3. The superconducting magnetic arrangement of claim 1, wherein the magnetic coil unit is held by six longitudinal bearing elements in the interior of the insulating vessel.

4. The superconducting magnetic arrangement of claim 1, wherein the longitudinal bearing elements are attached to the insulating vessel and the magnetic coil unit such that the longitudinal bearing elements are exposed to stress in the longitudinal direction.

5. The superconducting magnetic arrangement of claim 4, wherein each of the longitudinal bearing elements is exposed to tensile stress or compressive stress.

6. The superconducting magnetic arrangement of claim 5, wherein each of the longitudinal bearing elements is exposed to compressive stress.

7. The superconducting magnetic arrangement of claim 1, wherein none of the longitudinal bearing elements is parallel to another of the longitudinal bearing elements in the longitudinal direction.

8. The superconducting magnetic arrangement of claim 1, wherein the magnetic coil unit has two opposite ends, and the magnetic coil unit is surrounded by the insulating vessel, and
    wherein the longitudinal bearing elements are attached to first attachment points on the magnetic coil unit and to second attachment points on the insulating vessel.

9. The superconducting magnetic arrangement of claim 8, wherein the magnetic coil unit is cylindrical about the longitudinal axis, the insulating vessel is cylindrical about the longitudinal axis, or the magnetic coil unit and the insulating vessel are cylindrical about the longitudinal axis.

10. The superconducting magnetic arrangement of claim 8, wherein the longitudinal bearing elements extend from respective attachment points on the magnetic coil unit to respective attachment points on the insulating vessel such that the magnetic coil unit is supported by the longitudinal bearing elements, with a cylindrical axis extending in a horizontal plane.

11. The superconducting magnetic arrangement of claim 10, wherein the longitudinal bearing elements extend inclined to the horizontal plane.

12. The superconducting magnetic arrangement of claim 10, wherein the attachment points of the longitudinal bearing elements are arranged offset to one another on the magnetic coil unit at least partially in an axial direction of the magnetic coil unit.

13. The superconducting magnetic arrangement of claim 10, wherein the attachment points of the longitudinal bearing elements on the magnetic coil unit form a first triangle and, in a top view, the attachment points of the bearing elements on the insulating vessel form a second triangle, and
wherein, in the top view, the first triangle is offset with respect to the second triangle in a vertical direction.

14. The superconducting magnetic arrangement of claim 13, wherein the first triangle is offset by rotation by approximately 180°.

15. The superconducting magnetic arrangement of claim 13, wherein the magnetic coil unit is cylindrical about the longitudinal axis and the attachment points of the longitudinal bearing elements on the magnetic coil unit, and the attachment points of the longitudinal bearing elements on the insulating vessel, and the longitudinal bearing elements, are located below the longitudinal axis in the vertical direction.

16. The superconducting magnetic arrangement of claim 1, wherein the longitudinal bearing elements are rods or loops that are exposed to tensile, compressive, or tensile and compressive stress, and
wherein the loops are O-shaped or in a shape of a figure eight.

17. The superconducting magnetic arrangement of claim 1, wherein each of the longitudinal bearing elements comprises a non-linear spring element or is configured as a non-linear spring element,
wherein a spring stiffness of the non-linear spring element reduces in a longitudinal direction of the respective longitudinal bearing element when forces exerted on the respective longitudinal bearing element exceed forces exerted on the longitudinal bearing elements in a resting position of the superconducting magnetic arrangement.

18. The superconducting magnetic arrangement of claim 17, wherein the non-linear spring elements in the respective longitudinal bearing elements are arranged closer to the insulating vessel than to the magnetic coil unit.

19. A superconducting magnetic arrangement comprising:
a magnetic coil unit comprising superconducting magnetic coils; and
an insulating vessel, wherein the magnetic coil unit is arranged in the insulating vessel,
wherein the magnetic coil unit is held in an interior of the insulating vessel by a maximum of six longitudinal bearing elements, each of the longitudinal bearing elements being between the magnetic coil unit and the insulating vessel such that a rotary movement and a translatory movement of the magnetic coil unit relative to the insulating vessel is restrained by the longitudinal bearing elements,
wherein one end of each of the longitudinal bearing elements is attached to a ring on the insulating vessel at first respective attachment points, and another end of each of the longitudinal bearing elements is attached at a second respective attachment point on the magnetic coil unit,
wherein the ring extends perpendicularly to an axis of the magnetic coil unit, and a first subset of the second respective attachment points on the magnetic coil unit are partially offset toward one end and a second subset of the second respective attachment points on a housing of the magnetic coil unit are partially offset toward another end of the magnetic coil unit relative to the ring.

20. The superconducting magnetic arrangement of claim 19, wherein the ring is one or more projections extending from the insulating vessel into the interior of the insulating vessel.

21. The superconducting magnetic arrangement of claim 19, wherein the second attachment points of the longitudinal bearing elements are arranged on the ring symmetrically around a circumference of the ring.

22. The superconducting magnetic arrangement of claim 19, wherein two of the longitudinal bearing elements extend in a longitudinal direction from the ring towards the one end of the magnetic coil unit, and four of the longitudinal bearing elements extend in the longitudinal direction from the ring towards the other end of the magnetic coil unit.

23. The superconducting magnetic arrangement of claim 19, wherein three pairs of the longitudinal bearing elements are provided,
wherein the longitudinal bearing elements of a respective pair are attached at attachment points offset with respect to one another along a circumference of the ring and converge toward each other in a V-shape in a direction of an end of the magnetic coil unit,
wherein the longitudinal bearing elements of a pair extend in the direction of the one end of the magnetic coil unit and the longitudinal bearing elements of the other two pairs of the longitudinal bearing elements extend in the direction of the other end of the magnetic coil unit, and
wherein the longitudinal bearing elements of a respective pair are attached to a same attachment point on the magnetic coil unit.

24. The superconducting magnetic arrangement of claim 23, wherein the three pairs of the longitudinal bearing elements are arranged adjacent to one another in a circumferential direction of the ring, and
wherein adjacent longitudinal bearing elements of different pairs of the longitudinal bearing elements in the circumferential direction are attached to a same attachment point on the ring.

25. A superconducting magnetic arrangement comprising:
a magnetic coil unit comprising superconducting magnetic coils; and
an insulating vessel, wherein the magnetic coil unit is arranged in the insulating vessel,
wherein the magnetic coil unit is held in an interior of the insulating vessel by a maximum of six longitudinal bearing elements, each of the longitudinal bearing elements being between the magnetic coil unit and the insulating vessel such that a rotary movement and a translatory movement of the magnetic coil unit relative to the insulating vessel is restrained by the longitudinal bearing elements,
wherein three pairs of the longitudinal bearing elements are provided,
wherein the longitudinal bearing elements of a respective pair of the longitudinal bearing elements are attached to different attachment points on the magnetic coil unit and converge toward one another in a V-shape toward the insulating vessel, and
wherein the longitudinal bearing elements of a respective pair of the longitudinal bearing elements are attached to a same attachment point on the insulating vessel, and two longitudinal bearing elements of two different pairs of the longitudinal bearing elements are attached to a same attachment point on the magnetic coil unit.

* * * * *